(12) United States Patent
Vahala et al.

(10) Patent No.: US 10,886,691 B2
(45) Date of Patent: Jan. 5, 2021

(54) HIGH-Q OPTICAL RESONATOR WITH MONOLITHICALLY INTEGRATED WAVEGUIDE

(71) Applicant: California Institute of Technology, Pasadena, CA (US)

(72) Inventors: Kerry Vahala, Pasadena, CA (US);
Kiyoul Yang, Pasadena, CA (US);
Dong Yoon Oh, Pasadena, CA (US);
Seung Hoon Lee, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 244 days.

(21) Appl. No.: 15/587,897

(22) Filed: May 5, 2017

(65) Prior Publication Data
US 2018/0006424 A1    Jan. 4, 2018

Related U.S. Application Data

(60) Provisional application No. 62/333,006, filed on May 6, 2016.

(51) Int. Cl.
*H01S 3/06*        (2006.01)
*H01S 3/063*       (2006.01)
(Continued)

(52) U.S. Cl.
CPC .............. *H01S 3/0637* (2013.01); *G02B 6/122* (2013.01); *G02F 1/395* (2013.01); *H01S 3/0627* (2013.01);
(Continued)

(58) Field of Classification Search
CPC .. H01S 3/0637; H01S 3/0627; H01S 3/06791; H01S 3/08086; H01S 3/082;
(Continued)

(56) References Cited

U.S. PATENT DOCUMENTS

| 7,781,217 B2 * | 8/2010 | Armani .............. G01N 21/7746 436/57 |
| 8,818,146 B2 | 8/2014 | Vahala et al. |
| 9,293,887 B2 | 3/2016 | Li et al. |

OTHER PUBLICATIONS

Ultra High Q toroid microcavities on a chip by Kippenburg et al.*
(Continued)

*Primary Examiner* — Peter Radkowski
(74) *Attorney, Agent, or Firm* — David S. Alavi

(57) ABSTRACT

A ring optical resonator is formed on a substrate. An outer circumferential surface of the resonator substantially confines one or more circumferential resonant optical modes. The resonator is positioned above a void formed in the substrate and is supported above the void by a portion of a material layer on the substrate that extends radially inward above the void from an outer circumferential edge of the void to the outer circumferential surface of the resonator. An optical waveguide can be integrally formed on the substrate and traverses a portion of the material layer above the void. The optical waveguide and the ring optical resonator are arranged and positioned so as to establish evanescent optical coupling between them. Q-factors of $10^8$ or more have been achieved with a silica resonator and silicon nitride waveguide integrally formed on a silicon substrate.

24 Claims, 9 Drawing Sheets

(51) Int. Cl.

| | |
|---|---|
| *H01S 5/10* | (2006.01) |
| *H01S 5/227* | (2006.01) |
| *G02F 1/39* | (2006.01) |
| *H01S 3/08* | (2006.01) |
| *H01S 3/082* | (2006.01) |
| *H01S 3/067* | (2006.01) |
| *G02B 6/122* | (2006.01) |
| *G02B 6/293* | (2006.01) |

(52) U.S. Cl.
CPC .......... *H01S 3/06791* (2013.01); *H01S 3/082* (2013.01); *H01S 3/08086* (2013.01); *H01S 5/1075* (2013.01); *H01S 5/2275* (2013.01); *G02B 6/29338* (2013.01)

(58) Field of Classification Search
CPC ....... H01S 5/1075; H01S 5/2275; G02B 6/12; G02F 1/395
USPC .......................................................... 385/50
See application file for complete search history.

(56) References Cited

OTHER PUBLICATIONS

Adiabatic microring resonators by Watts.*
Ikeda et al., A microelectromechanically tunable microring resonator composed of freestanding silicon photonic waveguide couplers , Applied Physics Letters 102, 221113, (Year: 2013).*
Vahala, K. J. Optical microcavities. Nature 424, 839-846 (2003).
Kippenberg, T. J., Holzwarth, R. & Diddams, S. A. Microresonator-based optical frequency combs. Science 332, 555-559 (2011).
Papp, S. B. et al. Microresonator frequency comb optical clock. Optica 1, 10-14 (2014).
Vollmer, F. & Arnold, S. Whispering-gallery-mode biosensing: label-free detection down to single molecules. Nature Methods 5, 591-596 (2008).
Lu, T. et al. High sensitivity nanoparticle detection using optical microcavities. Proceedings of the National Academy of Sciences 108, 5976-5979 (2011).
Vollmer, F. & Yang, L. Label-free detection with high-Q microcavities: a review of biosensing mechanisms for integrated devices. Nanophotonics 1, 267-291 (2012).
Kimble, H. J. The quantum internet. Nature 453, 1023-1030 (2008).
Kippenberg, T. J. & Vahala, K. J. Cavity optomechanics: backaction at the mesoscale. Science 321, 1172-1176 (2008).
Spencer, D. T. et al, Towards an integrated-photonics optical-frequency synthesizer with <1 Hz residual frequency noise. In Optical Fiber Communication Conference, M2J.2 (2017).
Frank, I. et al. A low-power, chip-scale optical atomic clock with enhanced stability. In Joint Navigation Conference (2017).
Suh, M.-G., Yang, Q.-F., Yang, K. Y., Yi, X. & Vahala, K. J. Microresonator soliton dual-comb spectroscopy. Science 354, 600-603 (2016).
Dell'Olio, F., Tatoli, T., Ciminelli, C. & Armenise, M. Recent advances in miniaturized optical gyroscopes. Journal of the European Optical Society—Rapid publications 9 14013 (2014).
Li, J., Suh, M.-G. & Vahala, K. Microresonator Brillouin gyroscope. Optica 3, 346-348 (2017).
DelHaye, P. et al. Optical frequency comb generation from a monolithic microresonator. Nature 450, 1214-1217 (2007).
Herr, T. et al. Temporal solitons in optical microresonators. Nature Photonics 8, 145-152 (2014).
Yi, X., Yang, Q.-F., Yang, K. Y., Suh, M.-G. & Vahala, K. Soliton frequency comb at microwave rates in a high-Q silica microresonator. Optica 2, 1078-1085 (2015).
Lee, H. et al. Chemically etched ultrahigh-Q wedge-resonator on a silicon chip. Nature Photonics 6, 369-373 (2012).
Kippenberg, T. J., Spillane, S. M. & Vahala, K. J. Kerr-nonlinearity optical parametric oscillation in an ultrahigh-Q toroid microcavity. Physical Review Letters 93, 083904 (2004).
Savchenkov, A. A. et al. Low threshold optical oscillations in a whispering gallery mode CaF2 resonator. Physical Review Letters 93, 243905 (2004).
Spillane, S., Kippenberg, T. & Vahala, K. Ultralow-threshold Raman laser using a spherical dielectric microcavity. Nature 415, 621-623 (2002).
Aoki, T. et al. Observation of strong coupling between one atom and a monolithic microresonator. Nature 443, 671-674 (2006).
Armani, D., Kippenberg, T., Spillane, S. & Vahala, K. Ultra-high-Q torpid microcavity on a chip. Nature 421, 925-928 (2003).
Grudinin, I. S., Ilchenko, V. S. & Maleki, L. Ultrahigh optical Q factors of crystalline resonators in the linear regime. Physical Review A 74, 063806 (2006).
Moss, D. J., Morandotti, R., Gaeta, A. L. & Lipson, M. New CMOS-compatible platforms based on silicon nitride and hydex for nonlinear optics. Nature Photonics 7, 597-607 (2013).
Spencer, D. T., Bauters, J. F., Heck, M. J. & Bowers, J. E. Integrated waveguide coupled Si3N4 resonators in the ultrahigh-Q regime. Optica 1, 153-157 (2014).
Xuan, Y, et al. High-Q silicon nitride microresonators exhibiting low-power frequency comb initiation. Optica 3, 1171-1180 (2016).
Pfeiffer, M. H. et al. Photonic Damascene process for integrated high-Q microresonator based nonlinear photonics. Optica 3, 20-25 (2016).
Li, Q. et al. Stably accessing octave-spanning microresonator frequency combs in the soliton regime. arXiv preprint arXiv:1611.09229 (2016).
Pfeiffer, M. H. et al. Octave-spanning dissipative Kerr soliton frequency combs in Si3N4 microresonators. arXiv preprint arXiv:1701.08594 (2017).
Cal, M., Painter, O. & Vahala, K. J. Observation of critical coupling in a fiber taper to a silica-microsphere whispering-gallery mode system. Physical Review Letters 85, 74-77 (2000).
Spillane, S. M., Kippenberg, T. J., Painter, O. J. & J., V. K. Ideality in a fiber-taper-coupled microresonator system for application to cavity quantum electrodynamics. Physical Review Letters 91, 043902 (2003).
Jones, D. J. et al. Carrier-envelope phase control of femtosecond mode-locked lasers and direct optical frequency synthesis. Science 288, 635 (2000).
Li, J., Lee, H., Chen, T. & Vahala, K. J. Low-pump-power, low-phase-noise, and microwave to millimeter-wave repetition rate operation in microcombs. Physical Review Letters 109, 233901 (2012).
Almeida, V. R., Panepucci, R. R. & Lipson, M. Nanotaper for compact mode conversion. Optics letters 28, 1302-1304 (2003).
Lecaplain, C., Javerzac-Galy, C., Gorodetsky, M. & Kippenberg, T. Mid infrared ultra-high-Q resonators based on fluoride crystalline materials. Nature Communications 7,13383 (2016).
Brasch, V. et al. Photonic chip-based optical frequency comb using soliton Cherenkov radiation. Science 351, 357-360 (2016).
Yi, X., Yang, Q.-F., Yang, K. Y. & Vahala, K. Active capture and stabilization of temporal solitons in microresonators. Optics Letters 41, 2037-2040 (2016).
Li, J., Lee, H., Chen, T. & Vahala, K. J. Characterization of a high coherence, brillouin microcavity laser on silicon. Optics Express 20, 20170-20180 (2012).
Yang, K.Y., Lee, S. H., Yang, Q. F., Yi, X. & Vahala, K. Integrated Ultra-High Q Optical Resonator. arXiv preprint arXiv:1702.05076 (2017).

* cited by examiner

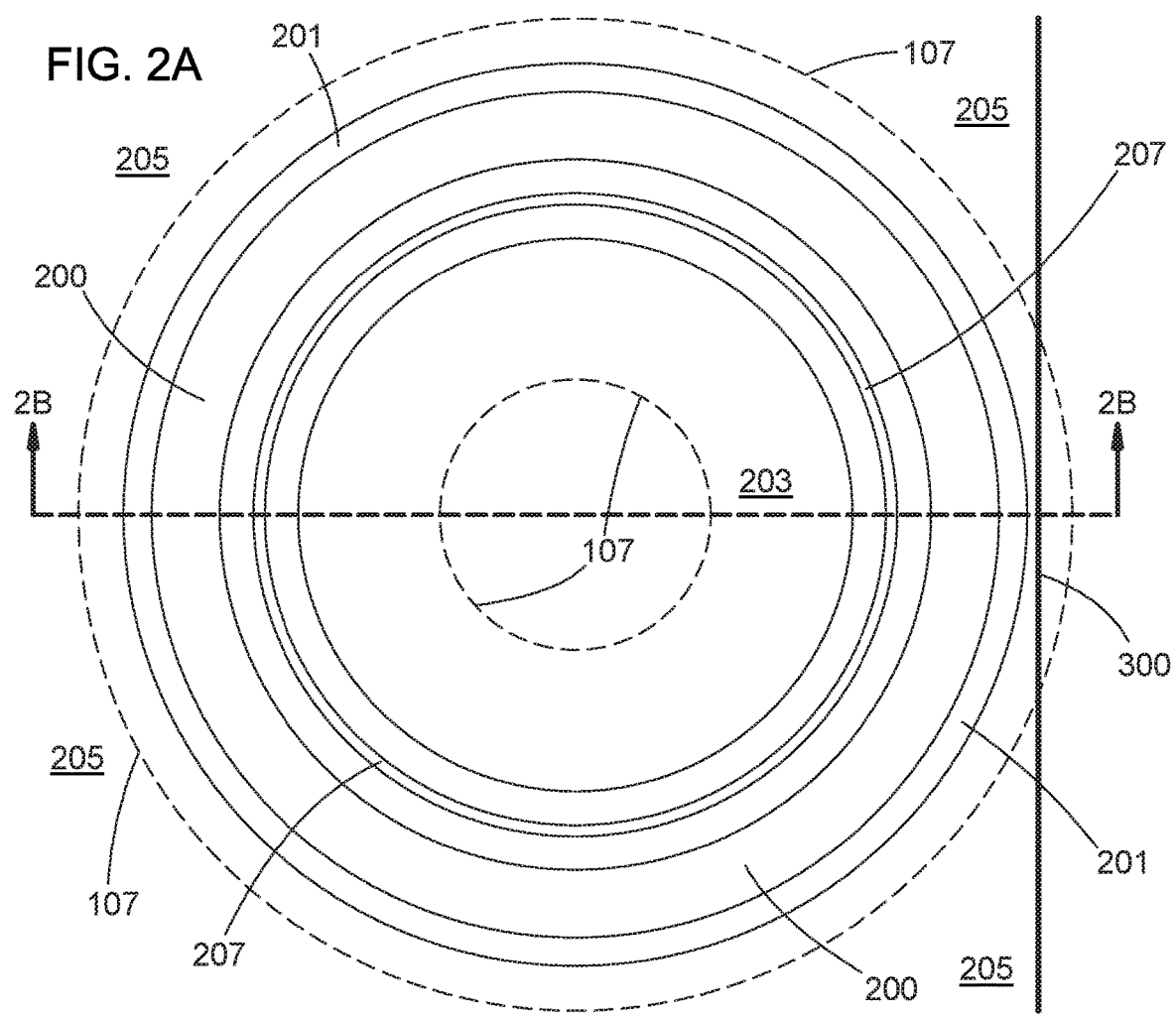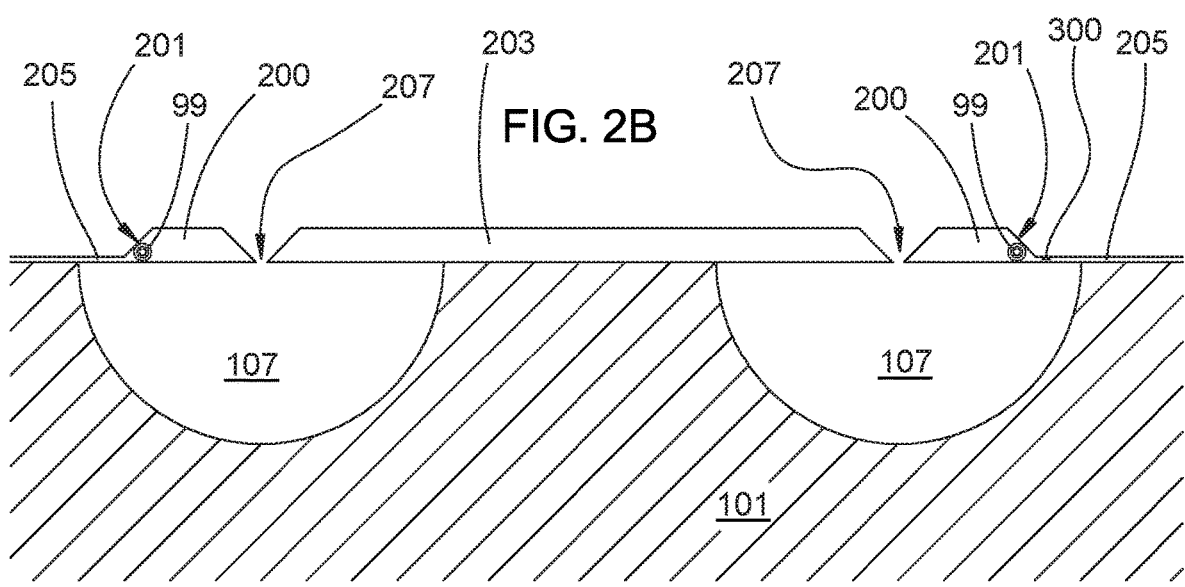

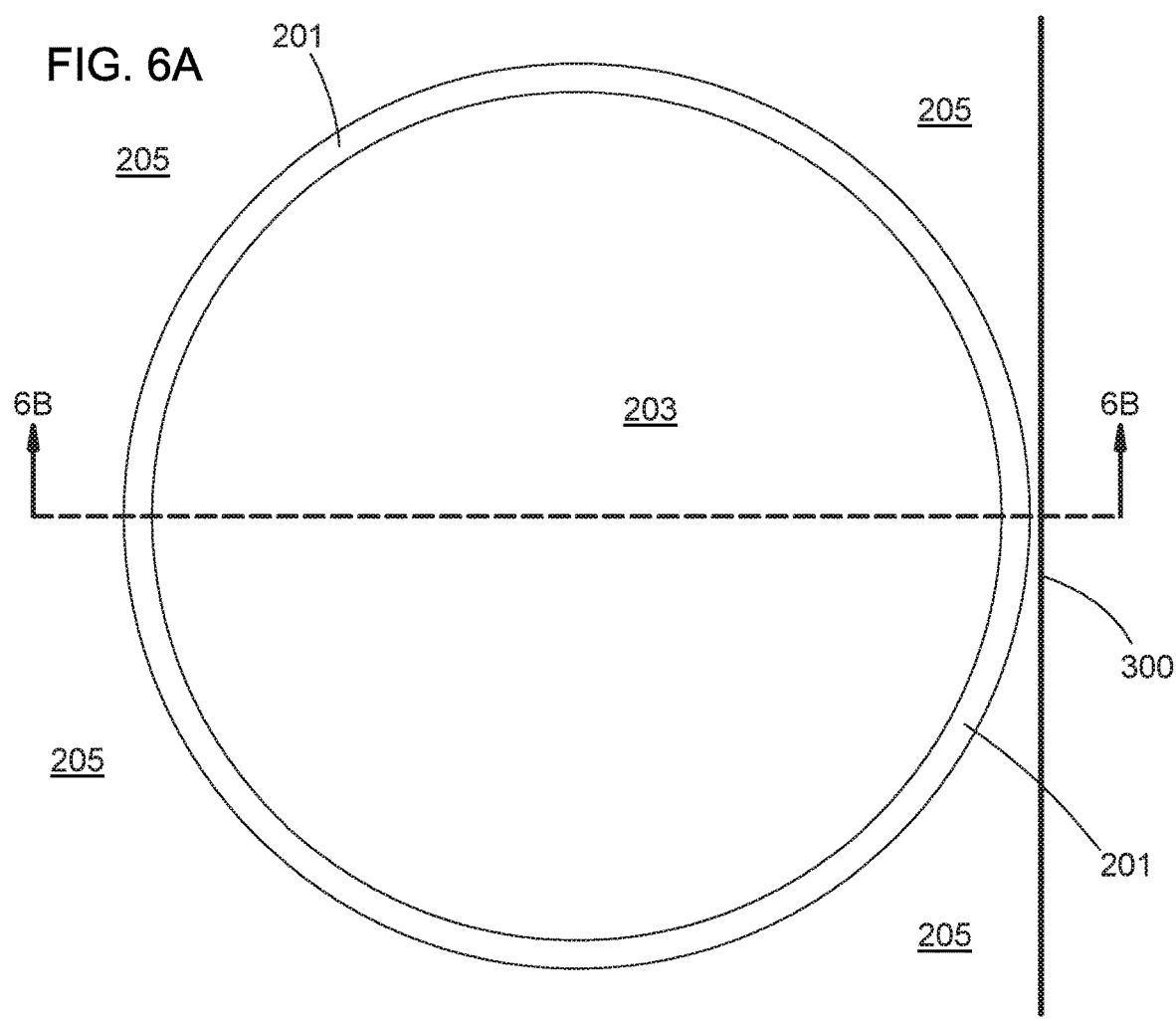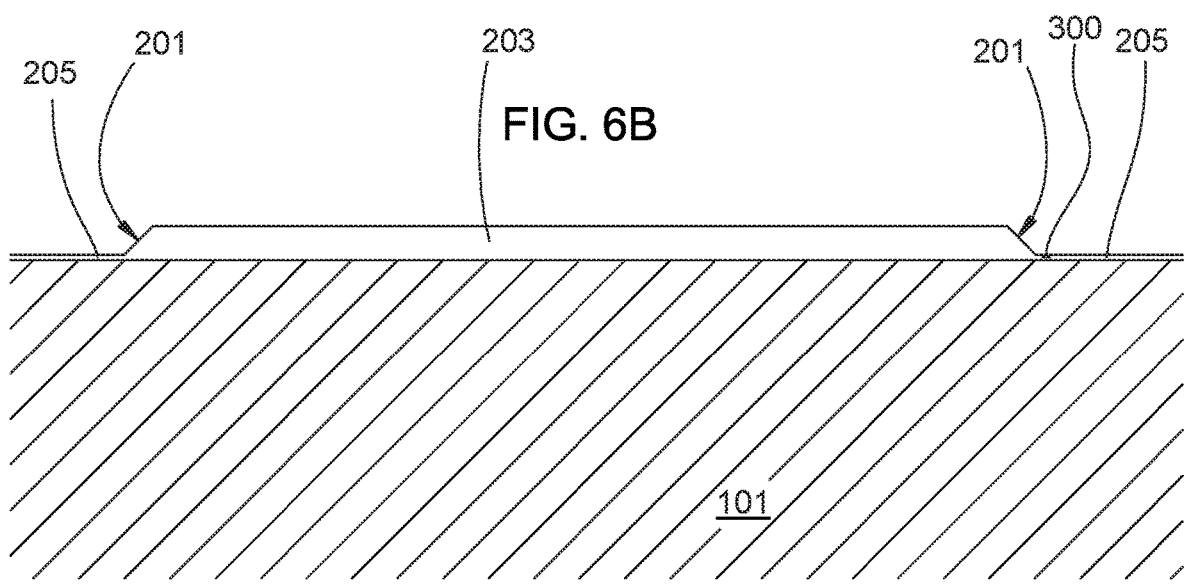

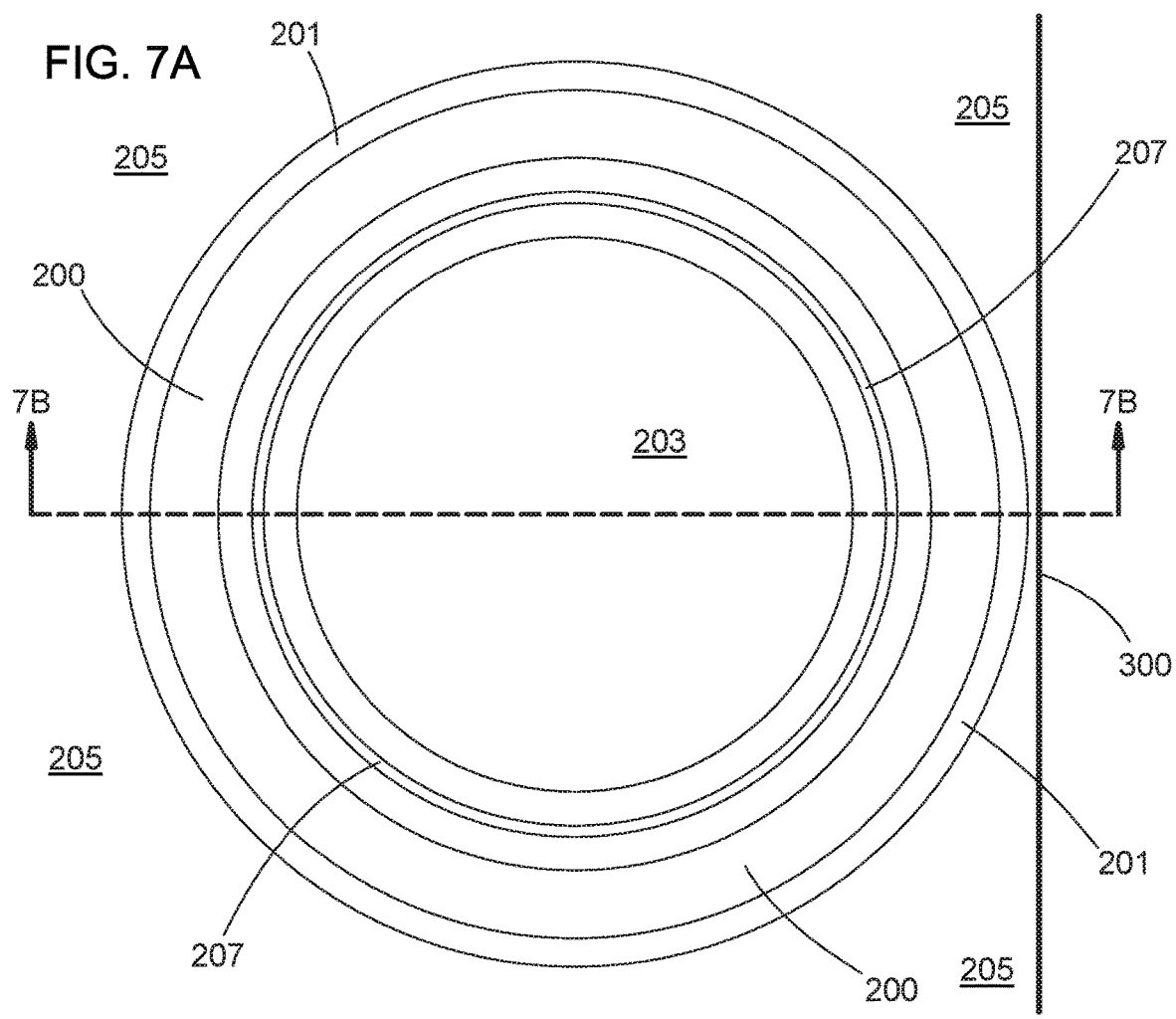
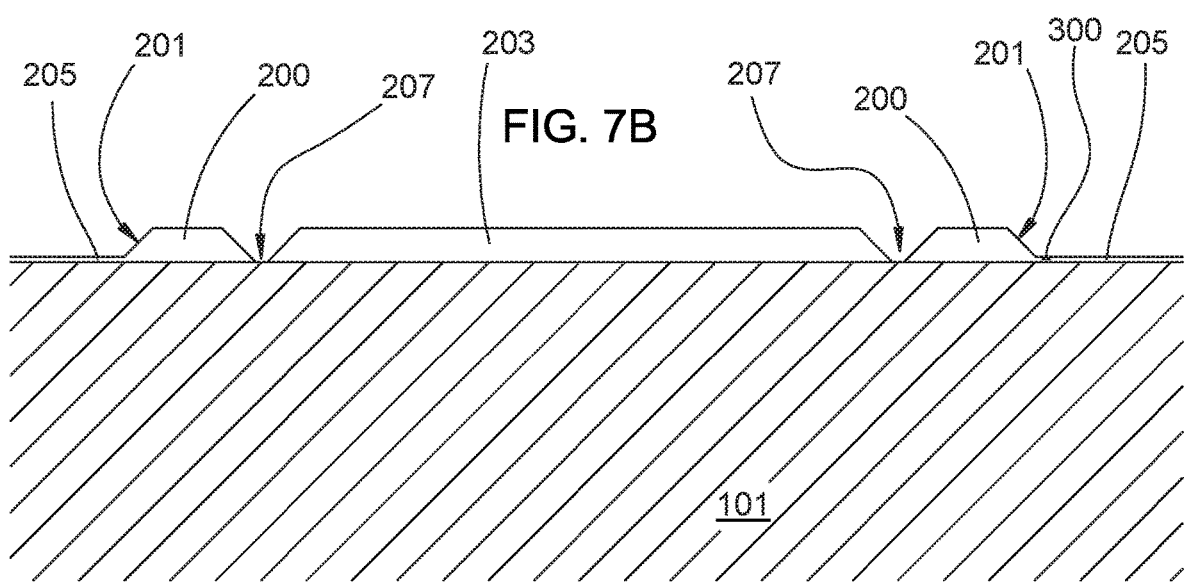

HIGH-Q OPTICAL RESONATOR WITH MONOLITHICALLY INTEGRATED WAVEGUIDE

CROSS-REFERENCE TO RELATED APPLICATIONS

This application claims benefit of U.S. provisional App. No. 62/333,006 filed May, 6, 2016 in the names of Kerry Vahala, Kiyoul Yang, Dong Yoon Oh, and Seung Hoon Lee, said provisional application being hereby incorporated by reference as if fully set forth herein.

STATEMENT REGARDING FEDERALLY SPONSORED RESEARCH OR DEVELOPMENT

This invention was made with government support under Grant No. HR0011-15-C-0055 awarded by the Defense Advanced Research Projects Agency (DARPA). The government has certain rights in the invention.

FIELD OF THE INVENTION

The field of the present invention relates to high-Q optical resonators. In particular, optical apparatus, and methods of fabrication thereof, are disclosed herein that include a high-Q optical resonator and can also include a monolithically integrated waveguide optically coupled to the resonator.

BACKGROUND

The following references disclose various aspects related to high-Q optical resonators, their fabrication, or their use. Each of the following reference are incorporated by reference as if fully set forth herein:

[1] Vahala, K. J. Optical microcavities. Nature 424, 839-846 (2003);

[2] Kippenberg, T. J., Holzwarth, R. & Diddams, S. A. Microresonator-based optical frequency combs. Science 332, 555-559 (2011);

[3] Papp, S. B. et al. Microresonator frequency comb optical clock. Optica 1, 10-14 (2014);

[4] Vollmer, F. & Arnold, S. Whispering-gallery-mode biosensing: label-free detection down to single molecules. Nature Methods 5, 591-596 (2008);

[5] Lu, T. et al. High sensitivity nanoparticle detection using optical microcavities. Proceedings of the National Academy of Sciences 108, 5976-5979 (2011);

[6] Vollmer, F. & Yang, L. Label-free detection with high-Q microcavities: a review of biosensing mechanisms for integrated devices. Nanophotonics 1, 267-291 (2012);

[7] Kimble, H. J. The quantum internet. Nature 453, 1023-1030 (2008);

[8] Kippenberg, T. J. & Vahala, K. J. Cavity optomechanics: back-action at the mesoscale. Science 321, 1172-1176 (2008);

[9] Spencer, D. T. et al. Towards an integrated-photonics optical-frequency synthesizer with <1 Hz residual frequency noise. In Optical Fiber Communication Conference, M2J.2 (2017);

[10] Frank, I. et al. A low-power, chip-scale optical atomic clock with enhanced stability. In Joint Navigation Conference (2017);

[11] Suh, M.-G., Yang, Q.-F., Yang, K. Y., Yi, X. & Vahala, K. J. Microresonator soliton dual-comb spectroscopy. Science 354, 600-603 (2016);

[12] Dell'Olio, F., Tatoli, T., Ciminelli, C. & Armenise, M. Recent advances in miniaturized optical gyroscopes. Journal of the European Optical Society—Rapid publications 9 14013 (2014);

[13] Li, J., Suh, M.-G. & Vahala, K. Microresonator Brillouin gyroscope. Optica 3, 346-348 (2017);

[14] DelHaye, P. et al. Optical frequency comb generation from a monolithic microresonator. Nature 450, 1214-1217 (2007);

[15] Herr, T. et al. Temporal solitons in optical microresonators. Nature Photonics 8, 145-152 (2014);

[16] Yi, X., Yang, Q.-F., Yang, K. Y., Suh, M.-G. & Vahala, K. Soliton frequency comb at microwave rates in a high-Q silica microresonator. Optica 2, 1078-1085 (2015);

[17] Lee, H. et al. Chemically etched ultrahigh-Q wedge-resonator on a silicon chip. Nature Photonics 6, 369-373 (2012);

[18] Kippenberg, T. J., Spillane, S. M. & Vahala, K. J. Kerr-nonlinearity optical parametric oscillation in an ultrahigh-Q toroid microcavity. Physical Review Letters 93, 083904 (2004);

[19] Savchenkov, A. A. et al. Low threshold optical oscillations in a whispering gallery mode CaF2 resonator. Physical Review Letters 93, 243905 (2004);

[20] Spillane, S., Kippenberg, T. & Vahala, K. Ultralow-threshold Raman laser using a spherical dielectric microcavity. Nature 415, 621-623 (2002);

[21] Aoki, T. et al. Observation of strong coupling between one atom and a monolithic microresonator. Nature 443, 671-674 (2006);

[22] Armani, D., Kippenberg, T., Spillane, S. & Vahala, K. Ultra-high-Q toroid microcavity on a chip. Nature 421, 925-928 (2003);

[23] Grudinin, I. S., Ilchenko, V. S. & Maleki, L. Ultrahigh optical Q factors of crystalline resonators in the linear regime. Physical Review A 74, 063806 (2006);

[24] Moss, D. J., Morandotti, R., Gaeta, A. L. & Lipson, M. New CMOS-compatible platforms based on silicon nitride and hydex for nonlinear optics. Nature Photonics 7, 597-607 (2013);

[25] Spencer, D. T., Bauters, J. F., Heck, M. J. & Bowers, J. E. Integrated waveguide coupled Si3N4 resonators in the ultrahigh-Q regime. Optica 1, 153-157 (2014);

[26] Xuan, Y. et al. High-Q silicon nitride microresonators exhibiting low-power frequency comb initiation. Optica 3, 1171-1180 (2016);

[27] Pfeiffer, M. H. et al. Photonic Damascene process for integrated high-Q microresonator based nonlinear photonics. Optica 3, 20-25 (2016);

[28] Li, Q. et al. Stably accessing octave-spanning microresonator frequency combs in the soliton regime. arXiv preprint arXiv:1611.09229 (2016);

[29] Pfeiffer, M. H. et al. Octave-spanning dissipative Kerr soliton frequency combs in Si3N4 microresonators. arXiv preprint arXiv:1701.08594 (2017);

[30] Cai, M., Painter, O. & Vahala, K. J. Observation of critical coupling in a fiber taper to a silica-microsphere whispering-gallery mode system. Physical Review Letters 85, 74-77 (2000);

[31] Spillane, S. M., Kippenberg, T. J., Painter, O. J. & J., V. K. Ideality in a fiber-taper-coupled microresonator system for application to cavity quantum electrodynamics. Physical Review Letters 91, 043902 (2003);

[32] Jones, D. J. et al. Carrier-envelope phase control of femtosecond mode-locked lasers and direct optical frequency synthesis. Science 288, 635 (2000);

[33] Li, J., Lee, H., Chen, T. & Vahala, K. J. Low-pump-power, low-phase-noise, and microwave to millimeter-wave repetition rate operation in microcombs. Physical Review Letters 109, 233901 (2012);

[34] Almeida, V. R., Panepucci, R. R. & Lipson, M. Nanotaper for compact mode conversion. Optics letters 28, 1302-1304 (2003);

[35] Lecaplain, C., Javerzac-Galy, C., Gorodetsky, M. & Kippenberg, T. Mid-infrared ultra-high-Q resonators based on fluoride crystalline materials. Nature Communications 7,13383 (2016);

[36] Brasch, V. et al. Photonic chip-based optical frequency comb using soliton Cherenkov radiation. Science 351, 357-360 (2016);

[37] Yi, X., Yang, Q.-F., Yang, K. Y. & Vahala, K. Active capture and stabilization of temporal solitons in microresonators. Optics Letters 41, 2037-2040 (2016);

[38] Li, J., Lee, H., Chen, T. & Vahala, K. J. Characterization of a high coherence, brillouin microcavity laser on silicon. Optics Express 20, 20170-20180 (2012);

[39] Yang, K. Y., Oh, D. Y., Lee, S. H., Yang, Q.-F., Yi, X. & Vahala, K. Integrated Ultra-High-Q Optical Resonator. arXiv preprint arXiv:1702.05076 (2017);

[40] U.S. Pat. No. 8,818,146 entitled "Silica-on-silicon waveguides and related fabrication methods" issued Aug. 26, 2014 to Vahala et al;

[41] U.S. Pat. No. 9,293,887 entitled "Chip-based laser resonator device for highly coherent laser generation" issued Mar. 22, 2016 to Li et al.

Optical microcavities provide diverse functions that include, inter alia, frequency microcombs, soliton mode-locked microcombs, high-coherence Brillouin lasers, bio- and nano-particle sensors, cavity optomechanical systems, parametric oscillators, Raman lasers, and strong-coupling cavity QED systems. Key performance metrics scale at least as $1/Q$ and frequently as $1/Q^2$ across all applications areas and have accounted for a sustained period of progress in boosting Q-factor by reducing optical loss in micron- and millimeter-scale resonators. Numerous cavity designs routinely exceed a Q-factor of $10^7$ or even higher. Also, advances in resonator integration have made possible on-chip waveguide coupling to low-optical-loss resonators that incorporate silicon nitride and other materials. Octave-span, THz-repetition-rate, soliton combs with integrated waveguides have resulted from these new capabilities. Nonetheless, Finding a fabrication pathway that maximizes Q-factor while maintaining a scalable, integration-ready fabrication process has proven challenging. Fiber tapers and prisms are typically used, for example, to efficiently couple optical power to the highest-Q-factor devices, which are silica- and crystalline-based devices.

At the same time, proposals for miniature navigation, remote sensing and metrology systems have emerged requiring the performance advantages of higher-Q-factor silica or crystalline designs, but with full integration capability. These new application areas also require millimeter-scale resonators. For example, detectable pulse repetition rates are needed in frequency combs in order to self-reference the comb. However, to attain detectable rates in a microcavity frequency comb the mode volume must be substantially increased to reduce the resonator free-spectral-range (FSR). Similarly, optical gyroscopes need large diameter resonators to increase the Sagnac effect and boost sensitivity. For example, recent Brillouin-based gyroscopes use an 18 mm diameter disk-laser design to achieve navigation-level sensitivity. Stronger resonant build-up provided by higher-Q-factor devices is desirable in each of these applications in order to sustain a higher resulting stored energy at an acceptable pump power level. Presently, only taper- and prism-coupled crystalline and silica resonators are suitable for such uses.

Much of the preceding can be found in one or more of the references incorporated above.

SUMMARY

An inventive optical apparatus comprises a ring optical resonator on a substrate. An outer circumferential surface of the ring optical resonator is arranged so as to substantially confine one or more circumferential resonant optical modes of the ring optical resonator. The ring optical resonator is positioned above a void formed in the substrate and is supported above the void by a portion of a layer of material on the substrate. That portion of the layer extends radially inward above the void from an outer circumferential edge of the void to the outer circumferential surface of the ring optical resonator. The inventive optical apparatus can further include an optical waveguide integrally formed on the substrate. At least a portion of the optical waveguide traverses a portion of the material layer above the void. The optical waveguide and the ring optical resonator are arranged and positioned so as to establish evanescent optical coupling between them. Q-factors of $10^8$ or more have been achieved with a silica resonator and silicon nitride waveguide integrally formed on a silicon substrate.

Objects and advantages pertaining to a high-Q optical resonator that can be monolithically integrated with an optical waveguide may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIGS. 2A and 2B are schematic top and cross-sectional views, respectively, of an example of an inventive optical resonator and an integrated optical waveguide formed on a substrate.

FIGS. 3A, 4A, 5A, 6A, and 7A are top views, and FIGS. 3B, 4B, 5B, 6B, and 7B are cross-sectional views, schematically illustrating an example of an inventive sequence for fabricating on a substrate the inventive optical resonator and the integrated optical waveguide of FIGS. 2A and 2B.

The embodiments depicted are shown only schematically: all features may not be shown in full detail or in proper proportion, certain features or structures may be exaggerated relative to others for clarity, and the drawings should not be regarded as being to scale. The embodiments shown are only examples: they should not be construed as limiting the scope of the present disclosure or appended claims.

DETAILED DESCRIPTION OF EMBODIMENTS

Figure 1A:
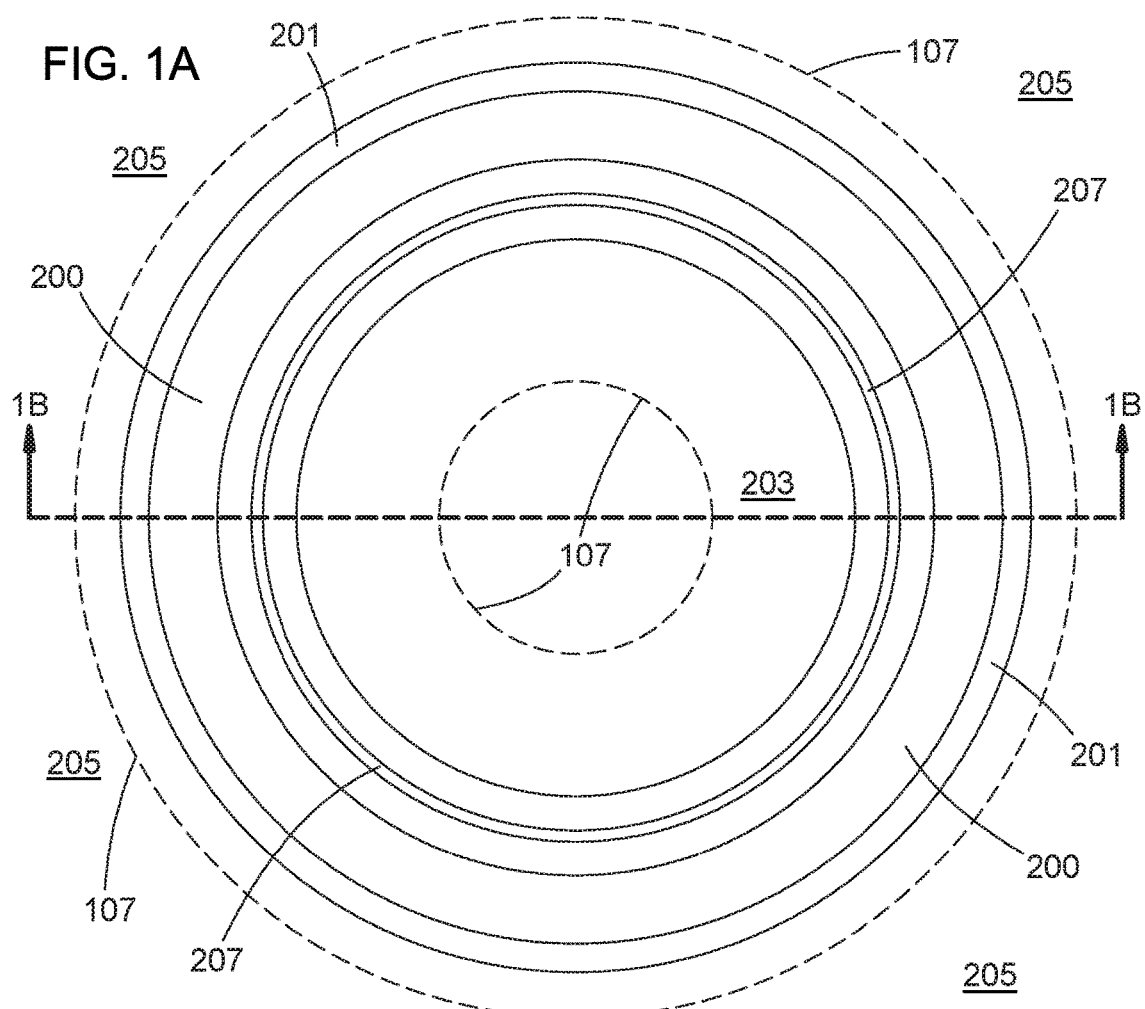
FIGS. 1A and 1B are schematic top and cross-sectional views, respectively, of an example of an inventive optical resonator formed on a substrate.
Figure 1B:
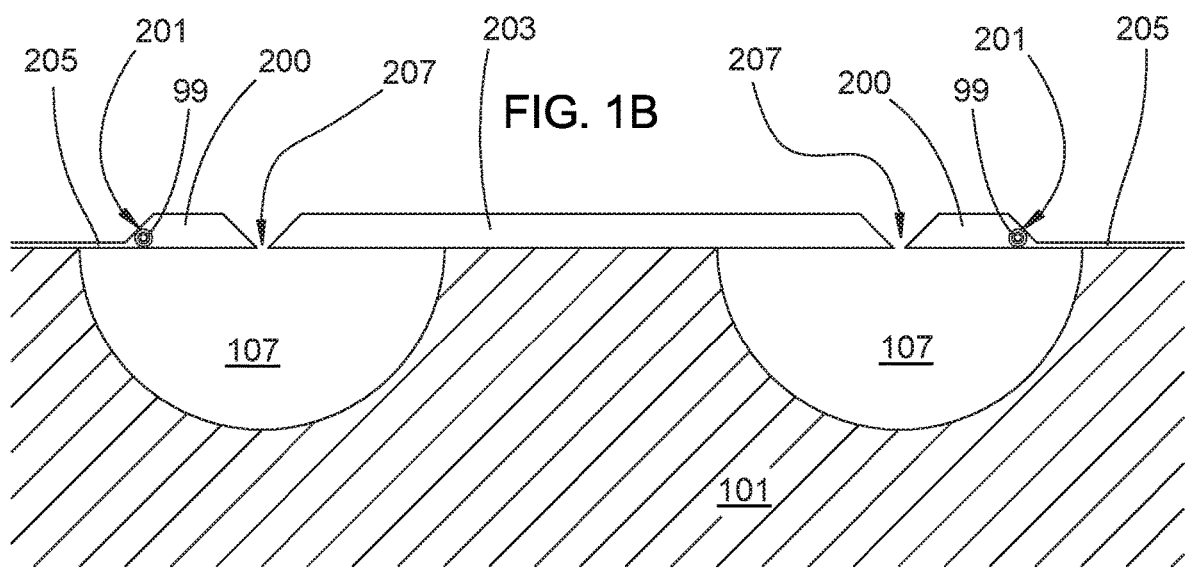

FIGS. 1A/1B and 2A/2B illustrate schematically an example of an inventive ring optical resonator 200 formed on a substrate 101; the example of FIGS. 2A/2B includes an optical waveguide 300 integrally formed on the substrate 101. The phrase "integrally formed" as employed in the present disclosure or appended claims shall denote structures that are formed as parts of a monolithically integrated whole (as opposed to initially discrete parts that are assembled together to form the whole). The phrase "on the substrate" as employed in the present disclosure or appended claims shall denote a structure or layer formed or positioned directly on the substrate, or formed or positioned on or in one or more layers on the substrate that include one or more materials different from the substrate material; if "on the substrate" is intended to be limited to directly on the substrate, that will be indicated explicitly. Although the example shown is in the form of a ring (i.e., having both inner and outer circumferential surfaces), the term "ring optical resonator" as employed in the present disclosure or appended claims shall denote any resonator structure that supports one or more circumferential resonant optical modes (e.g., so-called whispering gallery modes). A disk or microdisk resonator therefore would fall within the definition of a ring optical resonator. An outer circumferential surface 201 of the ring optical resonator 200 is arranged so as to substantially confine one or more circumferential resonant optical modes 99 of the ring optical resonator 200; the inner circumferential surface is essentially irrelevant, provided it is positioned sufficiently far from the outer circumferential surface so as to have little or no effect on the resonant optical modes 99. Note that a "confined" circumferential optical mode typically includes an evanescent portion that extends beyond the outer circumferential surface 201 of the resonator 200. The ring optical resonator often is circular, but other shapes (e.g., elliptical, oval, or otherwise generally convex) can be employed wherein the outer circumferential surface is sufficient to confine one or more circumferential optical modes.

The precise shape, arrangement, and position of the circumferential surface 201 heavily influences the behavior of the optical resonator 200. Several of the references incorporated above disclose suitable arrangements that yield high Q-factors for an optical resonator; Q-factors of $10^6$, $10^7$, $10^8$, or even greater have been achieved. A so-called silica wedge resonator has been found to be particularly suitable, wherein the outer circumferential surface 201 is a frustoconical surface that forms an acute angle with respect to a silicon substrate 101; angles from about 5° up to nearly 90° have been employed. In some examples a cylindrical outer circumferential surface 201 has been employed (i.e., wherein the angle with the substrate is about 90°). A frustoconical outer circumferential surface 201 is shown in the drawings, however, any other suitable shape can be employed for the outer circumferential surface 201 that (i) yields a suitably high Q-factor for a given use of the optical resonator and (ii) can be formed on the substrate 101 (along with the waveguide 300, if present) as described below.

To make use of the optical resonator, an optical signal must be coupled into or out of the resonator. Such optical coupling can occur by evanescent optical coupling with an optical waveguide that passes sufficiently close to the outer circumferential surface 201 of the ring optical resonator 200. For such optical coupling to occur, evanescent portions of optical modes supported by the resonator and the waveguide, respectively, must overlap spatially. In addition, optical frequency matching (or mismatching, as the case may be) and modal index matching (or mismatching, as the case may be) between the resonator and waveguide modes determines the degree to which an optical signal is transferred between those modes.

In a silica resonator formed from a silica layer on a silicon substrate, achieving a high Q-factor typically requires that the outer circumferential surface of the resonator be isolated from the silicon substrate. That condition has been achieved in conventional devices by employing an isotropic selective silicon etch after a disk resonator is formed from the silica layer on the silicon substrate. The etch undercuts the silicon substrate material to form a void under the outer circumference of the silica disk resonator, leaving the resonator supported by a central pedestal of silicon and suspended above the void formed in the substrate. The outer circumferential surface is therefore isolated from the silicon substrate and can exhibit the desired suitably high Q-factor.

One result of that conventional arrangement is an inability to monolithically integrate onto the substrate an optical waveguide evanescently coupled to the resonator, because the outer circumference of the resonator (where the evanescent portion of a resonant mode is located) is suspended above the void formed in the substrate. That location precludes integral formation of an optical waveguide on the substrate in an arrangement suitable for evanescent optical coupling with the resonator. Consequently, conventional devices incorporating such disk optical resonators typically employ fiber tapers or prisms for optical coupling with the resonator, which must be assembled with the resonator to establish optical coupling.

The inventive arrangement of the ring optical resonator shown in the examples of FIGS. 1A/1B and 2A/2B solves that problem. In a silica-on-silicon example, the ring optical resonator 200 is still suspended above a void 107 formed in the silicon substrate 101. However, in the inventive arrangement of FIGS. 1A/1B and 2A/2B, instead of support by a central silicon pedestal, the resonator 200 is supported above the void 107 by a portion of a thin layer 205 of silica on the substrate 101. A portion of the silica layer 205 extends radially inward above the void 107 from an outer circumferential edge of the void 107 to the outer circumferential surface 201 of the ring optical resonator 200. The presence of the layer 205 near the outer circumferential surface 201 of the resonator 200 allows an optical waveguide 300 to be integrally formed on the substrate 101 sufficiently close to the outer circumferential surface 201 to permit evanescent optical coupling between the waveguide 300 and the resonator 200. At least a portion of the optical waveguide 300 traverses a portion of the silica layer 205 above the void 107. In some examples, the waveguide 300 is formed on or within the silica layer 205. In some examples, additional layer material 205 is deposited over the waveguide 300 after it is formed, e.g., additional silica layer material 205 is deposited over a silicon nitride waveguide 300 to protect the silicon nitride from subsequent processing steps (see below). The silica layer 205 can be arranged (e.g., by being sufficiently thick) to limit optical coupling between the silicon nitride optical waveguide 300 and the silicon substrate 101 to a negligible level (e.g., to limit optical loss from the waveguide 300 to a level acceptable for a given application of the resonator 200). The silica layer 205 can be arranged (e.g., by being sufficiently thin) so as not to degrade the Q-factor of the ring optical resonator 200, or so as to limit such degradation to a negligible degree (e.g., so that the resonator 200 exhibits a Q-factor acceptably large for a given application of the resonator 200).

Figure 9A:
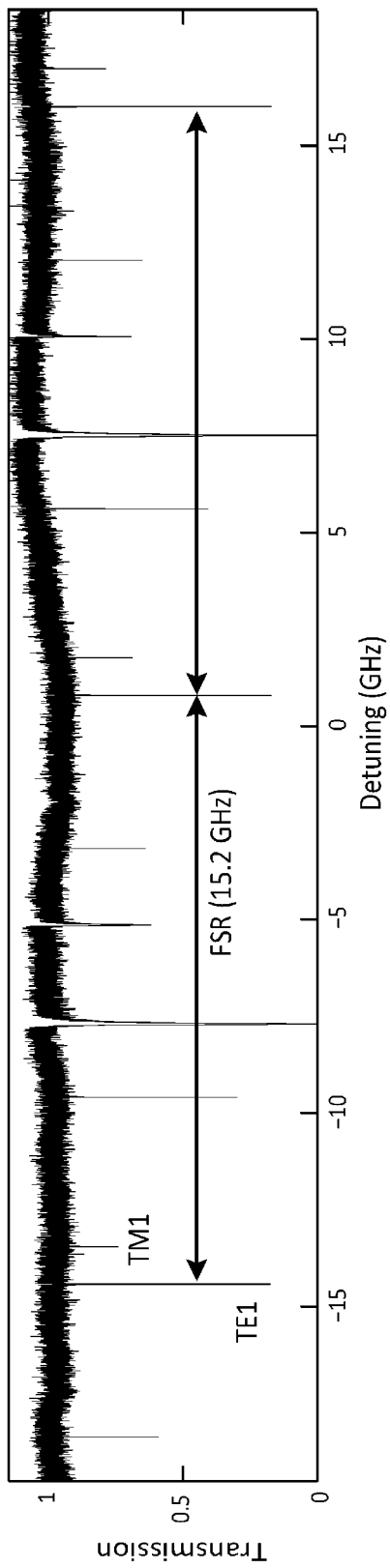
FIGS. 9A and 9B are spectral scans of light transmitted through the waveguide of the example of FIGS. 2A and 2B.
Figure 9C:
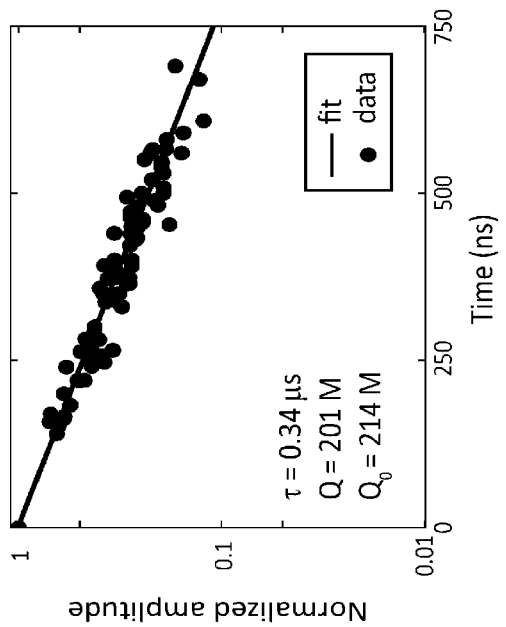
FIG. 9C is a plot of cavity-ringdown scans of the resonator of FIGS. 2A and 2B.
Figure 9B:
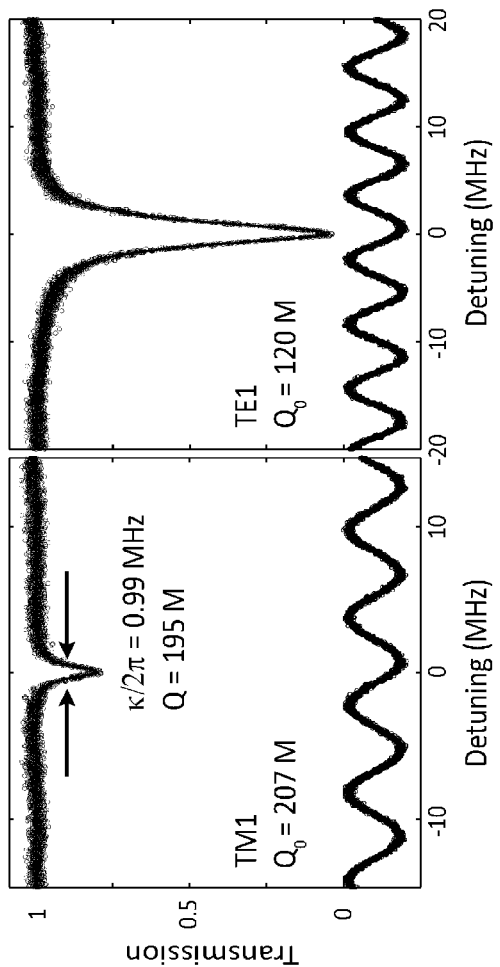

Q-factors greater than about $10^6$, $10^7$, $10^8$, $2\times10^8$, or even greater have been observed (for at least one resonant optical mode) in a silica resonator 200 arranged as in FIGS. 2A/2B with a silicon nitride waveguide 300. FIGS. 9A/9B are spectral scans of light transmitted through the silicon nitride waveguide 300 evanescently coupled to the silica ring resonator 200. In this example, the resonator 200 is about 4.3 mm in diameter and exhibits a free spectral range of about 15 GHz at a wavelength of about 1550 nm (FIG. 9A). The Q-factor for the TE1 transverse mode, estimated based on linewidth measurements (FIG. 9B) is about $1.2\times10^8$; the estimated Q-factor for the TM1 transverse mode is about $2.1\times10^8$. FIG. 9C is a plot of cavity-ringdown scans of the TM1 mode and also yields an estimated Q-factor of about $2.1\times10^8$ for the TM1 mode.

It may be desirable in some examples for a single optical resonator 200 on the substrate 101 to be optically coupled to two or more optical waveguides 300. In such examples, two or more waveguides 300, arranged as in FIGS. 2A/2B, can be integrally formed on a common substrate 101 with the resonator 200 and arranged, relative to the resonator 200, as shown in FIGS. 2A/2B. It may be desirable in some examples for a single optical waveguide 300 on the substrate 101 to be optically coupled to two or more optical resonators 200. In such examples, two or more resonators 200, arranged as in FIGS. 2A/2B, can be integrally formed on a common substrate 101. A single optical waveguide 300 can be integrally formed on the substrate 101 with the resonators 200 and arranged, relative to each resonator 200, as shown in FIGS. 2A/2B. It may be desirable in some examples for multiple resonators 200 and multiple waveguides 300 to be optically coupled, as described herein, in any desired combination; those multiple resonators 200 and waveguides 300 can be integrally formed on the substrate 101.

Any one or more suitable materials can be employed for the substrate 101, the ring optical resonator 200, the material later 205, or the optical waveguide 300. In some examples, (i) the substrate 101 can include one or more semiconductors, (ii) the ring optical resonator 200 can include one or more semiconductors, one or more metal or semiconductor oxides, one or more metal or semiconductor nitrides, or one or more metal or semiconductor oxynitrides, and (iii) the material layer 205 can include one or more metal or semiconductor oxides, one or more metal or semiconductor nitrides, or one or more metal or semiconductor oxynitrides. The optical waveguide 300 can include one or more semiconductors, one or more metal or semiconductor oxides, one or more metal or semiconductor nitrides, or one or more metal or semiconductor oxynitrides. For purposes of the present disclosure or appended claims: (i) "one or more semiconductors" can denote single-element semiconductor materials (e.g., silicon or germanium) or multiple-element semiconductor materials (e.g., GaAs, InP, or other III-V materials), and can also denote doped or undoped semiconductor materials; (ii) "one or more metal or semiconductor oxides" can include one or more doped or undoped oxide materials; and (iii) "one or more metal or semiconductor nitrides or oxynitrides" can include one or more doped or undoped nitride or oxynitride materials. In some particular examples, the substrate 101 comprises silicon, the ring optical resonator 200 comprises silicon oxide (i.e., silica), the material layer 205 comprises silicon oxide, and the optical waveguide 300 comprises silicon oxide, silicon nitride, or silicon oxynitride. Whatever materials are employed, the material layer 205 (i) can be arranged (e.g., by being sufficiently thin) so as limit degradation of the Q-factor of the resonator 200 to a negligible degree, or (ii) can be arranged (e.g., by being sufficiently thick) so as to limit optical coupling between the optical waveguide 300 and the substrate 101 to a negligible level.

The optical waveguide 300 can be arranged in any suitable way to achieve a desired degree of modal index matching for evanescent optical coupling with one or more resonant optical modes 99 of the ring optical resonator 200. In some examples, the optical waveguide can include a tapered segment arranged so that at least part of the portion traversing above the void 107 exhibits the desired degree of modal index matching. In some examples, one or more particular materials can be chosen, or can be arranged in a particular waveguide geometry, to achieve the desired degree of modal index matching.

The optical waveguide 300 can include a portion remote from the ring optical resonator 200 that is arranged so as to enable optical coupling to another optical element (not shown) formed on or assembled with the substrate 101. The remote portion of the optical waveguide 300 can be arranged as needed or desired for optical end coupling, evanescent optical coupling, or free-space optical coupling with another optical component formed on or assembled with the substrate 101.

A method for fabricating the ring optical resonator 200 on the substrate 101 comprises: (A) forming the ring optical resonator 200 on the substrate 101; (B) forming the material layer 205 on the substrate 101; and (C) forming in the substrate 101 the void 107 below the ring optical resonator 200 and a portion of the material layer 205. The method can further comprise forming an optical waveguide 300 on the substrate 101. Any one or more suitable spatially selective material processing techniques can be employed; those mentioned below are presented only as examples.

Figure 3A:
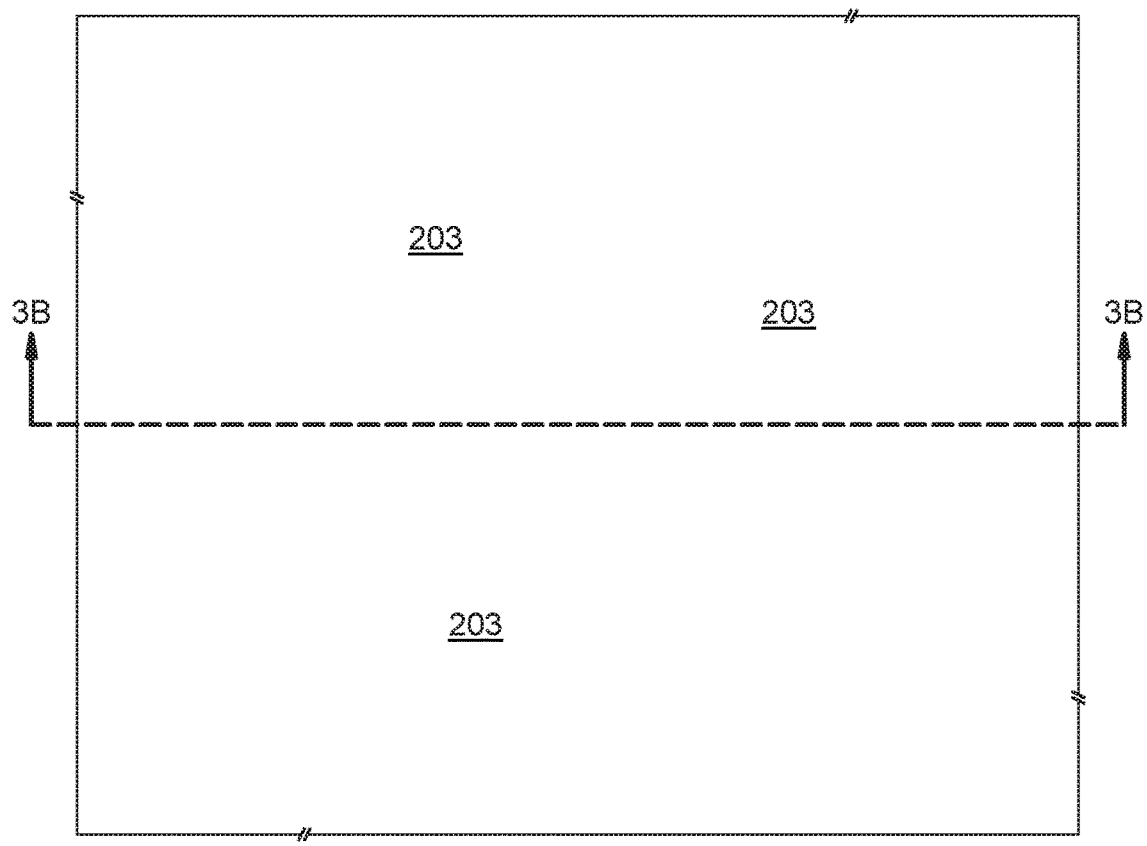
Figure 3B:
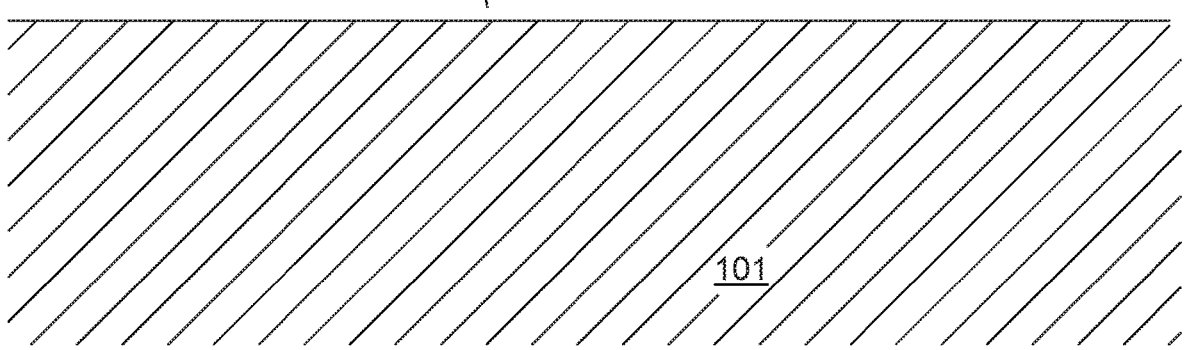
Figure 4A:
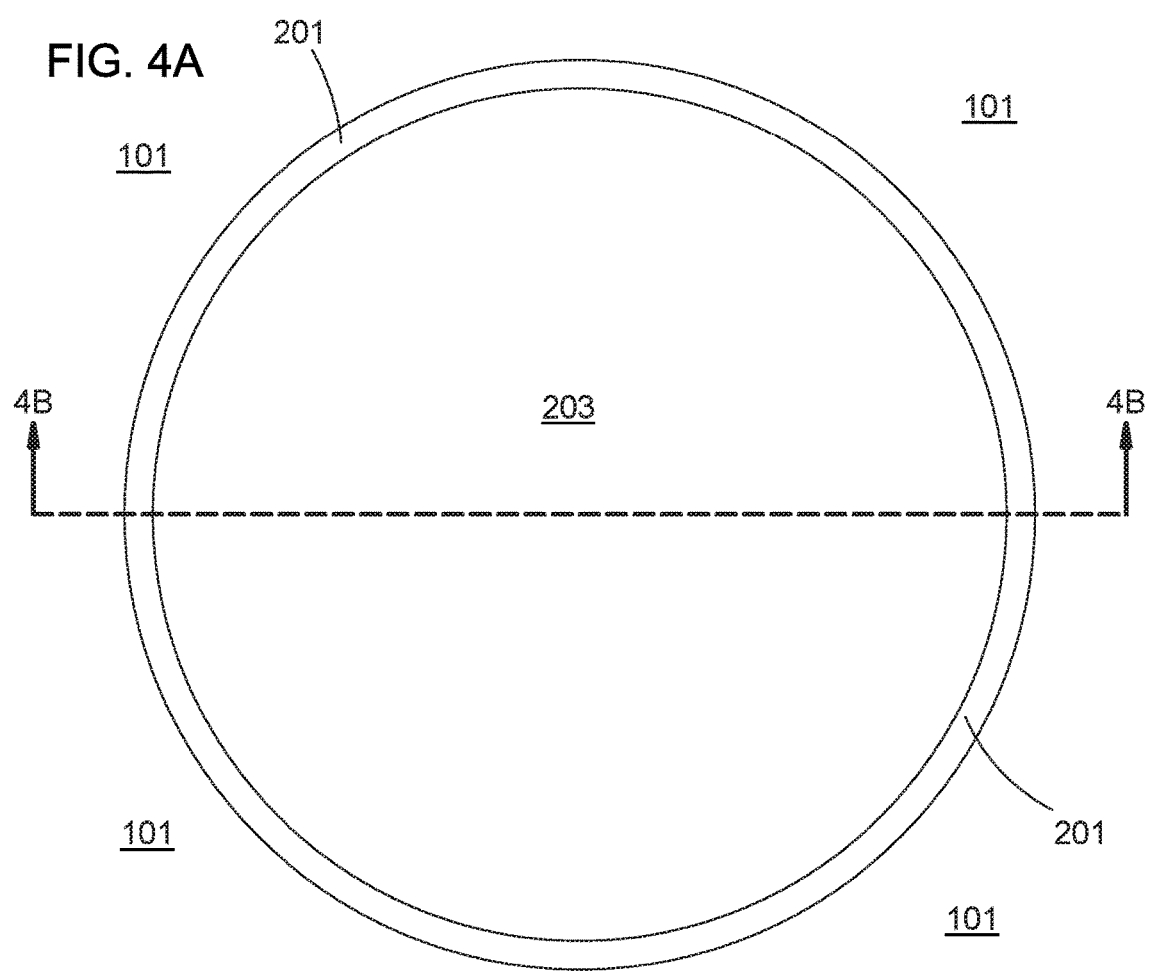
Figure 4B:
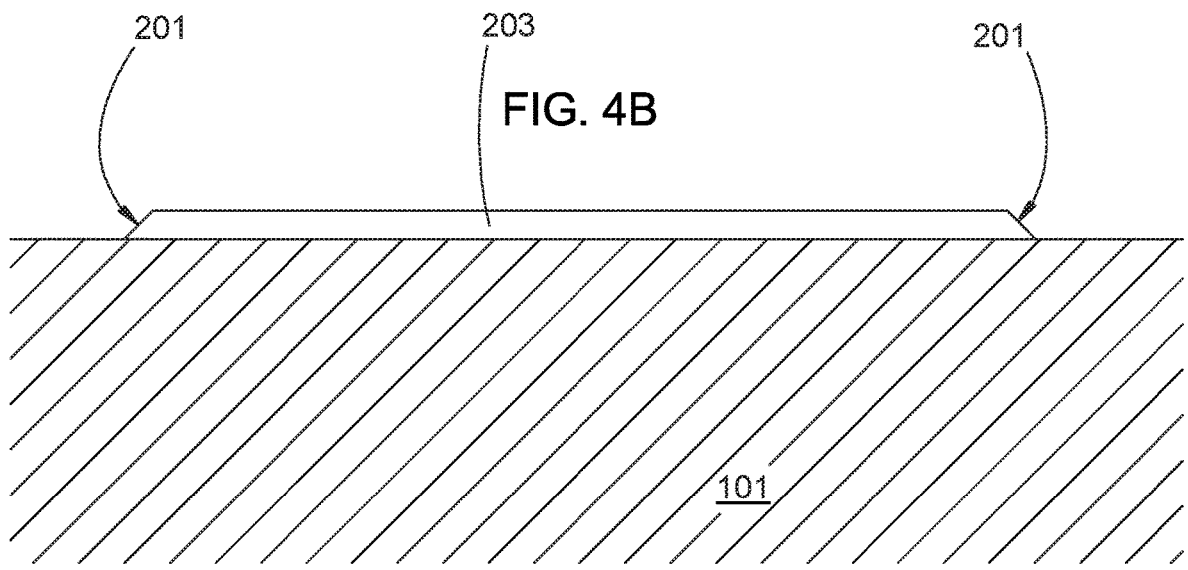
Figure 5A:
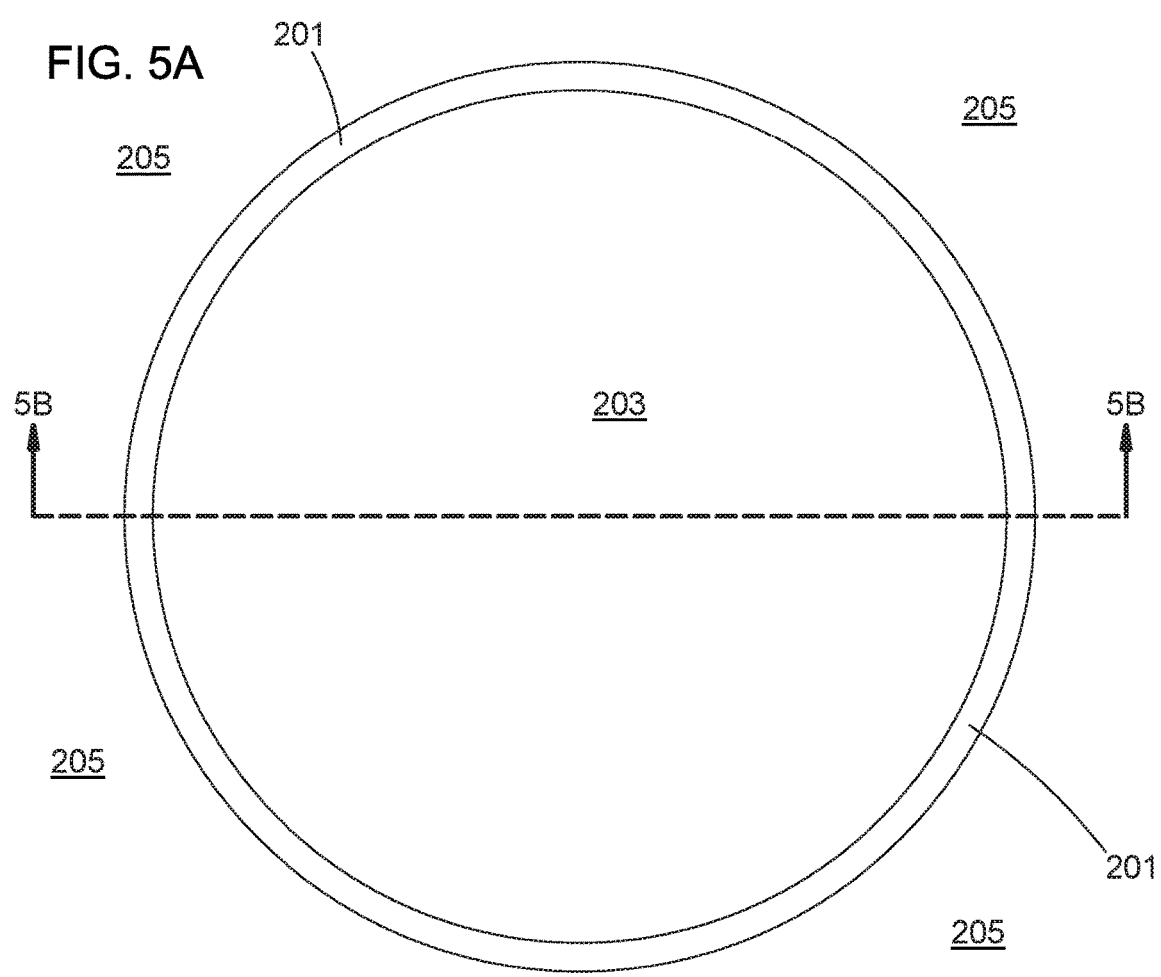
Figure 5B:
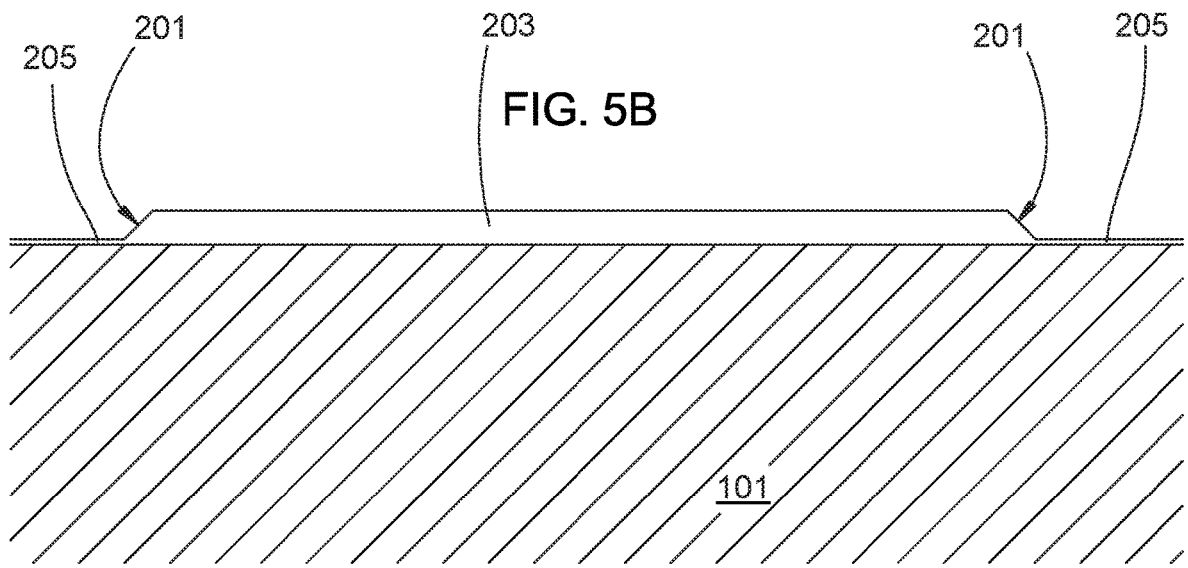

In an example wherein the substrate 101 is silicon, the optical resonator 200 and the material layer 205 are silica, and the optical waveguide is silicon nitride, a fabrication process is illustrated schematically in FIGS. 3A/3B, 4A/4B, 5A/5B, 6A/6B, and 7A/7B. FIGS. 3A/3B show a layer 203 (typically thermally grown oxide) on a silicon substrate 101. The circumferential surface 201 of the resonator is shown in FIGS. 4A/4B, and can be formed by (i) patterning a first etch mask on a first layer of silicon oxide 203 on a silicon substrate 101, (ii) applying a first wet etch (e.g., using buffered HF) to remove from the silicon substrate 101 an exposed area of the first silicon oxide layer 203 and thereby form a frustoconical outer circumferential surface 201, and (iii) removing the first etch mask. The silica layer 205 is shown in FIGS. 5A/5B, and is formed (e.g., by thermal oxidation) beneath the layer 203 and also on exposed areas of the silicon substrate 101 extending radially outward from the circumferential surface 201.

The optical waveguide 300 is shown in FIGS. 6A/6B. The waveguide 300 can be formed by (i) forming a layer of silicon nitride or silicon oxynitride (e.g., by PECVD) on the silica layers 203 and 205, (ii) patterning the silicon nitride or silicon oxynitride layer (e.g., using an ICP RIE dry etch followed by phosphoric acid) to form the optical waveguide 300, and (iii) forming an additional portion of the silica layer 205 over at least the optical waveguide 300 (using, e.g., CVD or atomic layer deposition; typically also formed over the entirety of silica layers 203 and 205).

In FIGS. 7A/7B, an area 207 of the substrate 101 has been exposed by (i) patterning a second etch mask on the silica layers 203 and 205, (ii) applying a second wet etch (e.g., using buffered HF) to remove from the silicon substrate 101 an exposed area of the first and second silicon oxide layers that are circumscribed by the ring optical resonator 200, and (iii) removing the second etch mask. Applying an isotropic etch (e.g., a $XeF_2$ dry etch) to the areas 207 of the silicon substrate 101 thus exposed forms the void 107 in the substrate 101 below the ring optical resonator 205 and a portion of the second silicon oxide layer 205, as shown in FIGS. 2A/2B (or in FIGS. 1A/1B, if the waveguide 300 was not formed).

Figure 8A:
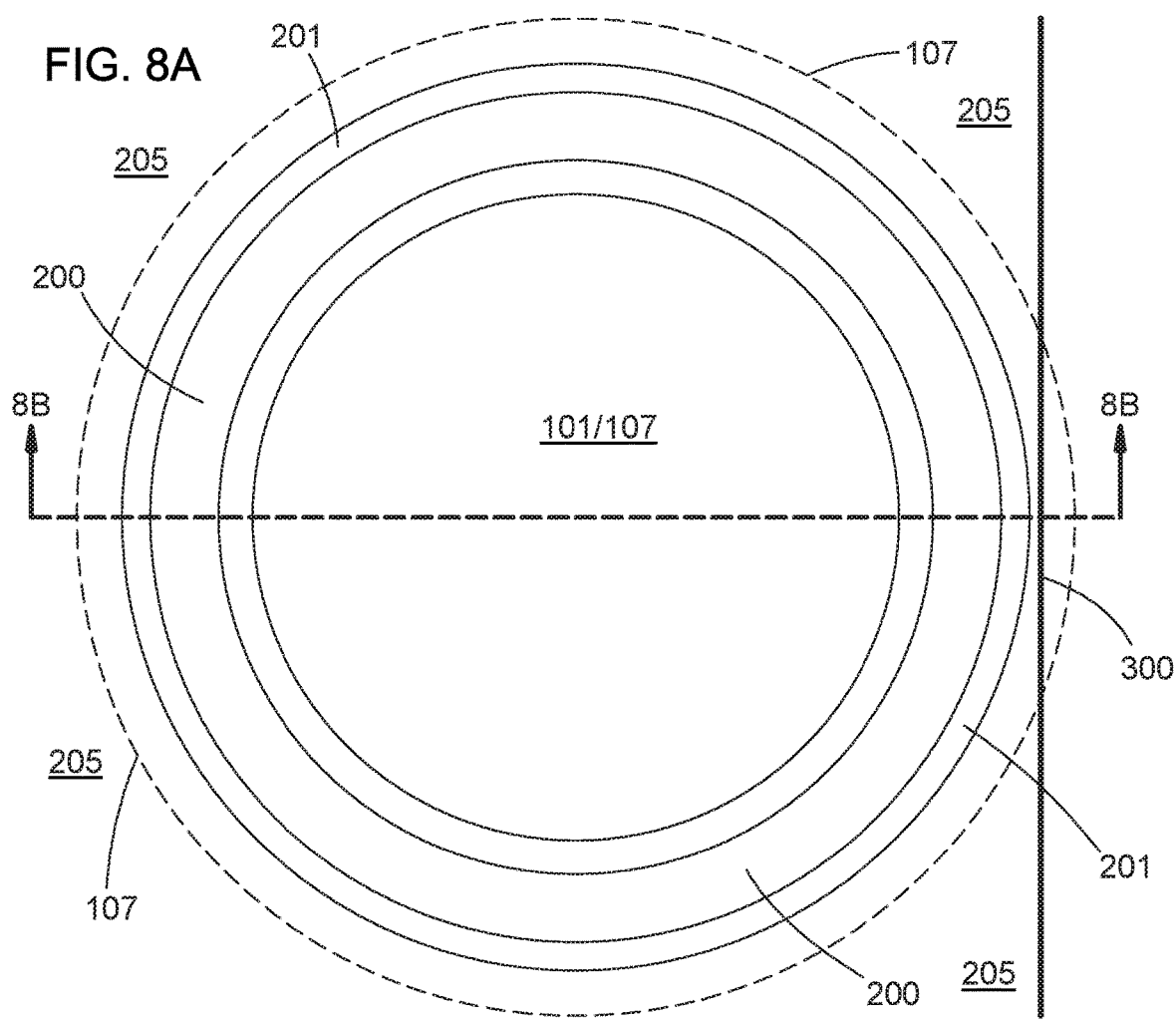
FIGS. 8A and 8B are top and cross-sectional views, respectively, of another example of an inventive optical resonator and an integrated optical waveguide formed on a substrate.
Figure 8B:
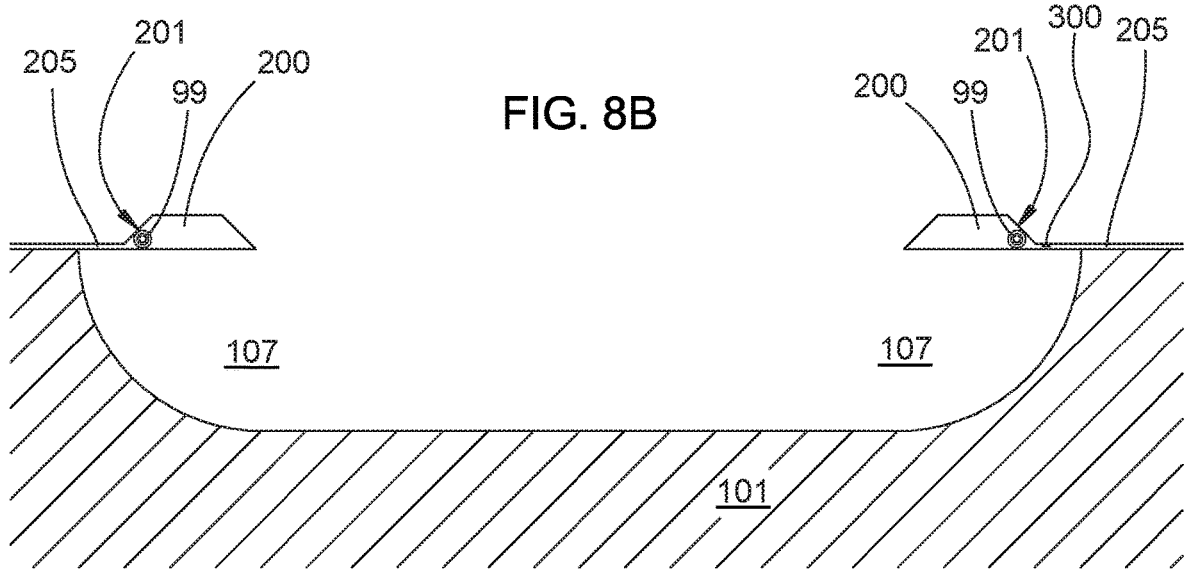

In the examples of FIGS. 1A/1B and 2A/2B, the exposed area 207 is a ring. After the final isotropic etch, the central portion of the silica layer 203 that remains is supported by a pedestal, and resembles a conventional disk resonator. That resemblance is fortuitous. The remaining central portion of the silica layer 203 is superfluous, and plays no part in the finished optical apparatus; there is no particular reason it needs to remain. In the example of FIG. 8A/8B, the exposed area 207 was large enough that the final isotropic etch removed all of the silica layer 203 except for the ring optical resonator 200, and no silicon pedestal remains. The exposed area 207 need not be a ring, and the area of layer 203 circumscribed by the resonator 200, that remains after all processing is finished, need not be completely separated from the resonator. Any arrangement of the area(s) 207 can be employed that results in the void 107 that is formed by the isotropic etch of the area(s) 207 being present beneath the entirety of the resonator 200 where the resonant modes 99 are present (as discussed above).

The patterning steps described above can be modified so as to form multiple optical waveguides 300 coupled to a single optical resonator 200. The patterning steps described above can be modified so as to form multiple optical resonators 200 coupled to a single optical waveguide 300. The patterning steps described above can be modified for performing wafer-scale simultaneous fabrication of many resonators 200 and corresponding coupled waveguides 300.

In addition to the preceding, the following examples fall within the scope of the present disclosure or appended claims:

EXAMPLE 1

An optical apparatus comprising a ring optical resonator on a substrate wherein: (a) an outer circumferential surface of the ring optical resonator is arranged so as to substantially confine one or more circumferential resonant optical modes of the ring optical resonator; and (b) the ring optical resonator is positioned above a void formed in the substrate and is supported above the void by a portion of a layer of material on the substrate, which portion of the material layer extends radially inward above the void from an outer circumferential edge of the void to the outer circumferential surface of the ring optical resonator.

EXAMPLE 2

The apparatus of Example 1 further comprising an optical waveguide integrally formed on the substrate wherein: (c) at least a portion of the optical waveguide traverses a portion of the material layer above the void; and (d) the optical waveguide and the ring optical resonator are arranged and positioned so as to establish evanescent optical coupling therebetween.

EXAMPLE 3

The apparatus of Example 2 wherein the optical waveguide is formed on or within the material layer, and the material layer is arranged so as to limit optical coupling between the optical waveguide and the substrate to a negligible level.

EXAMPLE 4

The apparatus of any one of Examples 1 through 3 wherein, for at least one resonant optical mode, the ring optical resonator exhibits a Q-factor greater than about $10^6$.

EXAMPLE 5

The apparatus of any one of Examples 1 through 4 wherein, for at least one resonant optical mode, the ring optical resonator exhibits a Q-factor greater than about $10^7$.

EXAMPLE 6

The apparatus of any one of Examples 1 through 5 wherein, for at least one resonant optical mode, the ring optical resonator exhibits a Q-factor greater than about $10^8$.

EXAMPLE 7

The apparatus of any one of Examples 1 through 6 wherein, for at least one resonant optical mode, the ring optical resonator exhibits a Q-factor greater than about $2\times10^8$.

EXAMPLE 8

The apparatus of any one of Examples 2 through 7 wherein at least part of the traversing portion of the optical waveguide is arranged so as to exhibit a desired degree of modal index matching for evanescent optical coupling with one or more resonant optical modes of the ring optical resonator.

EXAMPLE 9

The apparatus of Example 8 wherein the optical waveguide includes a tapered segment arranged so that at least part of the traversing portion exhibits the desired degree of modal index matching.

EXAMPLE 10

The apparatus of any one of Examples 8 or 9 wherein one or more materials of the optical waveguide are arranged so that at least part of the traversing portion exhibits the desired degree of modal index matching.

EXAMPLE 11

The apparatus of any one of Examples 2 through 10 wherein the optical waveguide includes a portion remote from the ring optical resonator that is arranged so as to enable optical coupling to another optical element formed on or assembled with the substrate.

EXAMPLE 12

The apparatus of Example 11 wherein the remote portion is arranged so as to establish optical end coupling with another optical component formed on or assembled with the substrate.

EXAMPLE 13

The apparatus of any one of Examples 11 or 12 wherein the remote portion is arranged so as to establish evanescent optical coupling with another optical component formed on or assembled with the substrate.

EXAMPLE 14

The apparatus of any one of Examples 11 through 13 wherein the remote portion is arranged so as to establish free-space optical coupling with another optical component formed on or assembled with the substrate.

EXAMPLE 15

The apparatus of any one of Examples 1 through 14 wherein the outer circumferential surface of the ring optical resonator is a cylindrical or frustoconical surface.

EXAMPLE 16

The apparatus of Example 15 wherein the outer circumferential surface of the optical ring resonator is a frustoconical surface that forms an acute angle with respect to the substrate.

EXAMPLE 17

The apparatus of Example 15 wherein the cylindrical or frustoconical outer circumferential surface of the optical ring resonator forms an angle between about 5° and about 90° with respect to the substrate.

EXAMPLE 18

The apparatus of any one of Examples 1 through 17 wherein (i) the substrate comprises one or more semiconductors, (ii) the ring optical resonator comprises one or more semiconductors, one or more metal or semiconductor oxides, one or more metal or semiconductor nitrides, or one or more metal or semiconductor oxynitrides, and (iii) the material layer comprises one or more metal or semiconductor oxides, one or more metal or semiconductor nitrides, or one or more metal or semiconductor oxynitrides.

EXAMPLE 19

The apparatus of Example 18 wherein the substrate comprises silicon, the ring optical resonator comprises silicon oxide, and the material layer comprises silicon oxide.

EXAMPLE 20

The apparatus of any one of Examples 2 through 19 wherein the optical waveguide comprises one or more semiconductors, one or more metal or semiconductor oxides, one or more metal or semiconductor nitrides, or one or more metal or semiconductor oxynitrides.

EXAMPLE 21

The apparatus of Example 20 wherein the substrate comprises silicon, the ring optical resonator comprises silicon oxide, the material layer comprises silicon oxide, and the optical waveguide comprises silicon oxide, silicon nitride, or silicon oxynitride.

EXAMPLE 22

A method for fabricating on the substrate the ring optical resonator of any one of Examples 1 through 21, the method comprising: (A) forming the ring optical resonator on the substrate so that the outer circumferential surface of the ring optical resonator is arranged so as to substantially confine the one or more circumferential resonant optical modes of the ring optical resonator; (B) forming the layer of material on the substrate that extends radially outward from the outer circumferential surface of the ring optical resonator; and (C) forming in the substrate the void below the ring optical resonator and a portion of the material layer so that the ring optical resonator is supported above the void by a portion of the material layer that extends radially inward above the void from an outer circumferential edge of the void to the outer circumferential surface of the ring optical resonator.

EXAMPLE 23

The method of Example 22 for fabricating the apparatus of any one of Examples 2 through 21 wherein: (D) the method further comprises forming the optical waveguide on the substrate; (E) at least a portion of the optical waveguide traverses the portion of the material layer above the void; and (F) the optical waveguide and the ring optical resonator are arranged and positioned so as to establish evanescent optical coupling therebetween.

EXAMPLE 24

The method of Example 22 for fabricating the ring optical resonator of Example 19 wherein: (A') part (A) comprises (i) patterning a first etch mask on a first layer of silicon oxide on a silicon substrate, (ii) applying a first wet etch to remove from the silicon substrate an exposed area of the first silicon oxide layer and thereby form a frustoconical outer circumferential surface of the ring optical resonator, and (iii) removing the first etch mask; (B') part (B) comprises forming a second layer of silicon oxide beneath the first silicon oxide layer and on exposed areas of the silicon substrate extending as the material layer radially outward from the outer circumferential surface of the ring optical resonator; and (C') part (C) comprises (i) patterning a second etch mask on the first and second silicon oxide layers, (ii) applying a second wet etch to remove from the silicon substrate an exposed area of the first and second silicon oxide layers that is circumscribed by the ring optical resonator, (iii) removing the second etch mask, (iv) applying an isotropic etch to an area of the silicon substrate exposed by the second wet etch to form the void in the substrate below the ring optical resonator and a portion of the second silicon oxide layer.

EXAMPLE 25

The method of Example 23 for fabricating the apparatus of Example 21 wherein: (A') part (A) comprises (i) patterning a first etch mask on a first layer of silicon oxide on a silicon substrate, (ii) applying a first wet etch to remove from the silicon substrate an exposed area of the first silicon oxide layer and thereby form a frustoconical outer circumferential surface of the ring optical resonator, and (iii) removing the first etch mask; (B') part (B) comprises, after part (A), forming a second layer of silicon oxide beneath the first silicon oxide layer and on exposed areas of the silicon substrate extending as the material layer radially outward from the outer circumferential surface of the ring optical resonator; (C') part (C) comprises, after part (B), (i) patterning a second etch mask on the first and second silicon oxide layers, (ii) applying a second wet etch to remove from the silicon substrate an exposed area of the first and second silicon oxide layers that is circumscribed by the ring optical resonator, (iii) removing the second etch mask, (iv) applying an isotropic etch to an area of the silicon substrate exposed by the second wet etch to form the void in the substrate below the ring optical resonator and a portion of the second silicon oxide layer; and (D') part (D) comprises, after part (B) and before part (C), (i) forming a layer of silicon nitride or silicon oxynitride on at least a portion of the second layer of silicon oxide, (ii) patterning the silicon nitride or silicon oxynitride layer to form the optical waveguide, and (iii) forming an additional portion of the second silicon oxide layer over at least the optical waveguide.

EXAMPLE 26

The apparatus of any one of Examples 2 through 21 further comprising one or more additional optical waveguides integrally formed on the substrate wherein: (c') at least a portion of each one of the one or more additional optical waveguides traverses a portion of the material layer above the void; and (d') the ring optical resonator and each one of the one or more additional optical waveguides are arranged and positioned so as to establish evanescent optical coupling between (i) the optical resonator and (ii) each one of the one or more additional optical waveguides.

EXAMPLE 27

The method of any one of Examples 23 or 25 for fabricating the apparatus of Example 26 wherein: (D') the method further comprises forming one or more additional optical waveguides on the substrate; (E') at least a portion of each one of the one or more additional optical waveguides traverses a portion of the material layer above the void; and (F') the ring optical resonator and each one of the one or more additional optical waveguides are arranged and positioned so as to establish evanescent optical coupling between (i) the optical resonator and (ii) each one of the one or more additional optical waveguides.

EXAMPLE 28

An optical apparatus comprising two or more of the ring optical resonators of any one of Examples 1 through 21 integrally formed on the substrate, the apparatus further comprising an optical waveguide of any one of Examples 2 through 21 integrally formed on the substrate wherein: (c) a corresponding portion of the optical waveguide traverses a corresponding portion of the material layer above the corresponding void of each one of the two or more optical resonators; and (d) the optical waveguide and the two or more ring optical resonators are arranged and positioned so as to establish evanescent optical coupling between the optical waveguide and each one of the two or more ring optical resonators.

EXAMPLE 29

The method of any one of Examples 22 or 24 for fabricating the apparatus of Example 27 wherein: (D) the method further comprises repeating steps (A) through (C) to form two or more ring optical resonators on the substrate; (E) the method further comprises forming an optical waveguide on the substrate; (F) a corresponding portion of the optical waveguide traverses a corresponding portion of the material layer above the corresponding void of each one of the two or more optical resonators; and (G) the optical waveguide and the two or more ring optical resonators are arranged and positioned so as to establish evanescent optical coupling between the optical waveguide and each one of the two or more ring optical resonators.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Thus, the appended claims are hereby incorporated into the Detailed Description, with each claim standing on its own as a separate disclosed embodiment. However, the present disclosure shall also be construed as implicitly disclosing any embodiment having any suitable set of one or more disclosed or claimed features (i.e., a set of features that are neither incompatible nor mutually exclusive) that appear in the present disclosure or the appended claims, including those sets that may not be explicitly disclosed herein. In addition, for purposes of disclosure, each of the appended dependent claims shall be construed as if written in multiple dependent form and dependent upon all preceding claims with which it is not inconsistent. It should be further noted that the scope of the appended claims does not necessarily encompass the whole of the subject matter disclosed herein.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure and appended claims, the words "comprising," "including," "having," and variants thereof, wherever they appear, shall be construed as open ended terminology, with the same meaning as if the phrase "at least" were appended after each instance thereof, unless explicitly stated otherwise. For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. An optical apparatus comprising a ring optical resonator on a substrate wherein:
   (a) an outer circumferential surface of the ring optical resonator is arranged so as to substantially confine one or more circumferential resonant optical modes of the ring optical resonator; and
   (b) the ring optical resonator is positioned above a void formed in the substrate and is supported above the void by a portion of a layer of material on the substrate, which portion of the material layer extends radially inward above the void from an outer circumferential edge of the void to the outer circumferential surface of the ring optical resonator.

2. The apparatus of claim 1 wherein (i) the substrate comprises one or more semiconductors, (ii) the ring optical resonator comprises one or more semiconductors, one or more metal or semiconductor oxides, one or more metal or semiconductor nitrides, or one or more metal or semiconductor oxynitrides, and (iii) the material layer comprises one or more metal or semiconductor oxides, one or more metal or semiconductor nitrides, or one or more metal or semiconductor oxynitrides.

3. The apparatus of claim 1 wherein the substrate comprises silicon, the ring optical resonator comprises silicon oxide, and the material layer comprises silicon oxide.

4. The apparatus of claim 1 further comprising an optical waveguide integrally formed on the substrate wherein:
   (c) at least a portion of the optical waveguide traverses a portion of the material layer above the void; and
   (d) the optical waveguide and the ring optical resonator are arranged and positioned so as to establish evanescent optical coupling therebetween.

5. The apparatus of claim 4 further comprising one or more additional optical waveguides integrally formed on the substrate wherein:
   (c') at least a portion of each one of the one or more additional optical waveguides traverses a portion of the material layer above the void; and
   (d') the ring optical resonator and each one of the one or more additional optical waveguides are arranged and positioned so as to establish evanescent optical coupling between (i) the optical resonator and (ii) each one of the one or more additional optical waveguides.

6. The apparatus of claim 4 wherein the optical waveguide is formed on or within the material layer, and the material layer is arranged so as to limit optical coupling between the optical waveguide and the substrate to a negligible level.

7. The apparatus of claim 4 wherein (i) the optical waveguide comprises one or more semiconductors, one or more metal or semiconductor oxides, one or more metal or semiconductor nitrides, or one or more metal or semiconductor oxynitrides, (ii) the substrate comprises one or more semiconductors, (iii) the ring optical resonator comprises one or more semiconductors, one or more metal or semiconductor oxides, one or more metal or semiconductor nitrides, or one or more metal or semiconductor oxynitrides, and (iv) the material layer comprises one or more metal or semiconductor oxides, one or more metal or semiconductor nitrides, or one or more metal or semiconductor oxynitrides.

8. The apparatus/method of claim 4 wherein the substrate comprises silicon, the ring optical resonator comprises silicon oxide, the material layer comprises silicon oxide, and the optical waveguide comprises silicon oxide, silicon nitride, or silicon oxynitride.

9. The apparatus of claim 4 wherein, for at least one resonant optical mode, the ring optical resonator exhibits a Q-factor greater than about $10^6$.

10. The apparatus of claim 4 wherein, for at least one resonant optical mode, the ring optical resonator exhibits a Q-factor greater than about $10^8$.

11. The apparatus of claim 4 wherein at least part of the traversing portion of the optical waveguide is arranged so as to exhibit a desired degree of modal index matching for evanescent optical coupling with one or more resonant optical modes of the ring optical resonator.

12. The apparatus of claim 11 wherein the optical waveguide includes a tapered segment arranged so that at least part of the traversing portion exhibits the desired degree of modal index matching.

13. The apparatus of claim 11 wherein one or more materials of the optical waveguide are arranged so that at least part of the traversing portion exhibits the desired degree of modal index matching.

14. The apparatus of claim 4 wherein the optical waveguide includes a portion remote from the ring optical resonator that is arranged so as to enable optical coupling to another optical element formed on or assembled with the substrate.

15. The apparatus of claim 1 wherein the outer circumferential surface of the ring optical resonator is a cylindrical or frustoconical surface.

16. The apparatus of claim 15 wherein the outer circumferential surface of the optical ring resonator is a frustoconical surface that forms an acute angle with respect to the substrate.

17. The apparatus of claim 15 wherein the cylindrical or frustoconical outer circumferential surface of the optical ring resonator forms an angle between about 5° and about 90° with respect to the substrate.

18. The apparatus of claim 1 wherein, for at least one resonant optical mode, the ring optical resonator exhibits a Q-factor greater than about $10^6$.

19. The apparatus of claim 1 wherein, for at least one resonant optical mode, the ring optical resonator exhibits a Q-factor greater than about $10^8$.

20. An optical apparatus comprising two or more of the ring optical resonators of claim 1 integrally formed on the substrate, the apparatus further comprising an optical waveguide integrally formed on the substrate wherein:
(c) a corresponding portion of the optical waveguide traverses a corresponding portion of the material layer above the corresponding void of each one of the two or more optical resonators; and
(d) the optical waveguide and the two or more ring optical resonators are arranged and positioned so as to establish evanescent optical coupling between the optical waveguide and each one of the two or more ring optical resonators.

21. A method for fabricating the apparatus of claim 1, the method comprising:
(A) forming the ring optical resonator on the substrate so that the outer circumferential surface of the ring optical resonator is arranged so as to substantially confine one or more circumferential resonant optical modes of the ring optical resonator;
(B) forming the layer of material on the substrate that extends radially outward from the outer circumferential surface of the ring optical resonator; and
(C) forming in the substrate the void below the ring optical resonator and a portion of the material layer so that the ring optical resonator is supported above the void by a portion of the material layer that extends radially inward above the void from an outer circumferential edge of the void to the outer circumferential surface of the ring optical resonator.

22. The method of claim 21 wherein:
(A') part (A) comprises (i) patterning a first etch mask on a first layer of silicon oxide on a silicon substrate, (ii) applying a first wet etch to remove from the silicon substrate an exposed area of the first silicon oxide layer and thereby form a frustoconical outer circumferential surface of the ring optical resonator, and (iii) removing the first etch mask;

(B') part (B) comprises forming a second layer of silicon oxide beneath the first silicon oxide layer and on exposed areas of the silicon substrate extending as the material layer radially outward from the outer circumferential surface of the ring optical resonator; and (C') part (C) comprises (i) patterning a second etch mask on the first and second silicon oxide layers, (ii) applying a second wet etch to remove from the silicon substrate an exposed area of the first and second silicon oxide layers that is circumscribed by the ring optical resonator, (iii) removing the second etch mask, (iv) applying an isotropic etch to an area of the silicon substrate exposed by the second wet etch to form the void in the substrate below the ring optical resonator and a portion of the second silicon oxide layer.

23. The method of claim 21 wherein:
(D) the method further comprises forming an optical waveguide on the substrate;
(E) at least a portion of the optical waveguide traverses a portion of the material layer above the void; and
(F) the optical waveguide and the ring optical resonator are arranged and positioned so as to establish evanescent optical coupling therebetween.

24. The method of claim 23 wherein:
(A') part (A) comprises (i) patterning a first etch mask on a first layer of silicon oxide on a silicon substrate, (ii) applying a first wet etch to remove from the silicon substrate an exposed area of the first silicon oxide layer and thereby form a frustoconical outer circumferential surface of the ring optical resonator, and (iii) removing the first etch mask;

(B') part (B) comprises, after part (A), forming a second layer of silicon oxide beneath the first silicon oxide layer and on exposed areas of the silicon substrate extending as the material layer radially outward from the outer circumferential surface of the ring optical resonator;

(C') part (C) comprises, after part (B), (i) patterning a second etch mask on the first and second silicon oxide layers, (ii) applying a second wet etch to remove from the silicon substrate an exposed area of the first and second silicon oxide layers that is circumscribed by the ring optical resonator, (iii) removing the second etch mask, (iv) applying an isotropic etch to an area of the silicon substrate exposed by the second wet etch to form the void in the substrate below the ring optical resonator and a portion of the second silicon oxide layer; and (D') part (D) comprises, after part (B) and before part (C), (i) forming a layer of silicon nitride or silicon oxynitride on at least a portion of the second layer of silicon oxide, (ii) patterning the silicon nitride or silicon oxynitride layer to form the optical waveguide, and (iii) forming an additional portion of the second silicon oxide layer over at least the optical waveguide.

* * * * *